United States Patent [19]

Clark et al.

[11] Patent Number: 5,077,268

[45] Date of Patent: Dec. 31, 1991

[54] PROCESING OF SUPERCONDUCTING CERAMICS USING MICROWAVE ENERGY

[75] Inventors: David E. Clark; Iftikhar Ahmad; Gregory T. Chandler, all of Gainesville, Fla.

[73] Assignee: University of Florida, Gainesville, Fla.

[21] Appl. No.: 177,744

[22] Filed: Apr. 5, 1988

[51] Int. Cl.$^5$ .................... B29C 35/08; H01L 39/24
[52] U.S. Cl. ......................................... 505/1; 264/25; 264/56; 264/66; 505/739; 505/742; 505/780
[58] Field of Search ..................... 264/22, 25, 27, 24, 264/56, 65, 66; 505/1, 800, 822, 823, 725, 739, 775, 780, 742, 741; 29/599

[56] References Cited

U.S. PATENT DOCUMENTS 4,695,695 9/1987 Meek et al. ................. 219/10.55 M

OTHER PUBLICATIONS

Sung et al, "Microstructure, Crystal Symmetry and Possible New Compounds in the System $Y_1Ba_2Cu_3O_{9-x}$", Jul. 1987.

Krage, "Microwave Sintering of Ferrites", Ceramic Bulletin, vol. 60, No. 11 (1981), pp. 1232–1234.

Johnson et al., "Fabrication of Ceramic Aricles from High $T_c$ Superconducting Oxides", High Temperature Superconductors, ed. Gubser et al, Apr. 23–24, 1987, pp. 193–195.

Maens et al, "Superconductivity in $YBa_2Cu_{3-y}Ni_yO_{7-8}$", 1987, pp. L774–776, Japanese Journal of Applied Physics.

Ishii et al, "Fabrication of Superconducting $YBa_2Cu_3O_{7-8}$ Films by a Tape Casting Method", Japanese Journal of Applied Physics, Dec. 1987, pp. L1959–L1960.

Wu et al, "Effects of Powder Preparation & Sintering on High Temperature Superconducting Y–Ba–Cu–O System", High Temp. Superconductors, ed Gubser et al., 1987, pp. 197–200.

Mathews et al, "Increased Transition Temperature in $YBa_2Cu_3O_y$ Superconducting Ceramics by Exposure to Nitrogen", Nature, vol. 328, Aug. 1987, pp. 786–787.

Baghurst et al., "Microwave Syntheses for Superconducting Ceramics", Mar. 24, 1988, p. 311, Nature, vol. 332, No. 6162.

Hwu et al., "Subsolidus Compatabilities in the $Y_2O_3$–BaO–CuO System via Diamagnetic Susceptibility", pp. C-165–C-167, Journal of the American Ceramic Society, vol. 70, No. 7, Jul. 1987.

Kishio et al., "Superconductivitiy Achieved at Over Liquid Nitrogen Temperature by (Mixed Rare Earths)–Ba–Cu Oxides", May 1987, pp. L694–L696, Japanese Journal of Applied Physics, vol. 26, No. 5, part 2.

Primary Examiner—Mary Lynn Theisen
Attorney, Agent, or Firm—Fleit, Jacobson, Cohn, Price, Holman & Stern

[57] ABSTRACT

A process for producing a superconducting ceramic material using microwave energy and the superconducting ceramic material produced thereby. A preferred process comprises the steps of mixing powders of $Y_2O_3$, CuO and at least one member selected from the group consisting of $BaCO_3$ and BaO, and then subjecting the resultant powder mixture to heat treatment in microwave energy. In a preferred embodiment, the heat treatment step comprises the steps of calcining, sintering and annealing, at least one of the calcining and annealing steps using microwave energy.

18 Claims, No Drawings

PROCESSING OF SUPERCONDUCTING CERAMICS USING MICROWAVE ENERGY

The present invention relates to the preparation of superconducting ceramics using microwave energy.

BACKGROUND OF THE INVENTION

In recent years, superconductive materials, including superconducting ceramic materials, have been proposed for use in many diverse applications. These uses include high speed computers, magnet-intensive technologies, transmission of electrical power, transportation and recreation, among others.

Since the discovery that ceramic systems can be superconducting above the liquid nitrogen temperature, a great deal of work has been done to prepare superconducting samples by a variety of methods. These methods include, but are not limited to, powder processing, melt spinning and various film deposition techniques. An appropriate combination of heat treatments of these samples makes them superconducting. The most commonly used method of heat treatment is conventional heating, wherein different parameters are varied to obtain optimum results.

Despite the recognition of the importance of the heat treatment, heat treatment is still carried out only by conventional methods. This is a time consuming method which allows undesirable grain growth resulting in non-uniform grain size and insufficient densification. Conventional methods heat from the outside inwardly, which promotes inhomogeneity. These deficiencies can lead to poor properties of the superconducting ceramic.

Therefore, it is an object of the present invention to provide an improved method for heating a number of ceramic systems to produce superconducting ceramics.

It is a further object of the present invention to provide a process for producing superconducting ceramics which does not suffer from the disadvantages of prior processes.

It is yet another object of the present invention to provide an efficient and effective method for producing superconducting ceramics.

It is still another object of the present invention to provide a process for uniformly heating ceramic materials which results in controlled microstructure and densification.

Additional objects of the present invention will be understood by reference to the following description.

SUMMARY OF THE INVENTION

In accordance with the present invention, ceramic materials are heated by microwave energy. Microwave processing has a novel internal heating pattern. This uniform heating is 50-100 times faster and the energy consumed is orders of magnitude lower than conventional heating. Processing of a ceramic material, by heating with microwave energy in accordance with the present invention, is significantly faster, potentially achieves higher temperatures, and uses far less energy than does conventional heating.

In addition, the rapid and more uniform internal heating of the ceramic material by microwave energy should result in a more controlled microstructure, densification and properties in accordance with the present invention.

DETAILED DESCRIPTION OF THE INVENTION

Many of the superconducting ceramics which are currently being explored are based on copper oxide (CuO). One of the most extensively studied systems is a yttrium-barium-copper-oxide (Y-Ba-Cu-O) ceramic material.

Heating of any ceramic material in a conventional furnace is possible. In order for the ceramic to be heated effectively to high temperatures by microwave radiation, the ceramic must exhibit significant loss mechanisms (absorption). Copper oxide is highly responsive to microwaves. This makes processing of superconducting ceramics containing copper oxide and/or any other highly absorbing material possible with microwave energy. The 1:2:3 phase (reacted form of Y-Ba-Cu-O) is also highly responsive to microwaves. Thus, in principle, other systems containing CuO or other highly microwave absorbing materials can be processed using microwave energy.

In accordance with one embodiment of the present invention, $Y_2O_3$, $BaCO_3$ and CuO powders are mixed in an appropriate ratio to produce a powder mixture. BaO powder may be substituted for all or a part of the $BaCO_3$ powder in the powder mixture. Preferably, the molar ratio of Y:Ba:Cu in the powder mixture is about 1:2:3. One preferred powder mixture comprises about 13.6 to 16.6% by weight $Y_2O_3$, about 47.7 to 58.2% by weight $BaCO_3$ and about 28.7 to 35.1% by weight CuO, based on the total weight of the powder mixture. A powder mixture comprising about 15.13% $Y_2O_3$ by weight, 52.95% by weight $BaCO_3$ and 31.92% by weight CuO, based on the total weight of the powder mixture, is especially preferred.

The starting material powders, i.e. the $Y_2O_3$, CuO and $BaCO_3$ and/or BaO powders, are mechanically mixed to produce a homogeneous powder mixture. This mechanical mixing may be conducted by any known powder mixing technique and, preferably, is conducted for a sufficient time to ensure homogeneity of the resultant powder mixture. The powder mixture thus obtained can then be heat treated, as set forth hereinafter, to obtain the desired ceramic product.

The powder mixture is pressed into the form of a disc or pellet prior to heat treatment. One method of forming a disc or pellet comprises pressing the powder mixture in a laboratory press under a pressure of 430 MPa. The shape and pressure of this step can be varied without significantly altering the final properties of the ultimate ceramic product. Other known ceramic forming techniques, such as slip casting, injection molding, tape casting, coatings, and the like, may be employed to produce specimens having a desired form or shape.

After the pressing or other shaping process, the specimen is subjected to a heat treatment which comprises at least one stage of heating by microwave energy. Under suitable conditions powder mixtures have been heated to desired temperatures in excess of 900° C. in a matter of minutes, by microwave energy. In some cases, the powder mixture has been heated to above 900° C. in no more than two minutes. The heating rate can, however, be controlled. The microwave oven used for this purpose was a single power (0.7 kW) domestic model (Hardwick, 2.45 GHz). Of course, the use of microwave ovens of differing power and/or frequency is considered to be within the scope of this invention.

According to a preferred embodiment of the invention, the heat treatment of the powder mixture discs or pellets comprises the sequential steps of calcining, sintering and annealing. The powder mixture formed into discs or pellets is initially heated to about 900° C. and maintained at a temperature of about 900° C. for up to 2 hours to allow calcination of the powder mixture. One objective of the calcination step is to obtain the desired phase that shows superconductivity. Although, the calcining step may comprise a single heating step, a preferred calcination process comprises initially heating the powder mixture and maintaining the powder mixture at a temperature of about 900° C. for a predetermined time to allow calcination, quenching the powdered mixture to room temperature, grinding and repelletizing the discs or pellets and subjecting the repelletized powder mixture to an additional calcining step at about 900° C. The cycle of calcining, grinding and repelletizing may be repeated more than once. Alternatively, the powder mixture may be calcined prior to being shaped or pressed, and then the calcined powder mixture may be formed into discs, pellets or other desired shapes before further processing.

Calcining temperatures significantly higher than 900° C. can decompose the superconducting phase of the ceramic product. Conversely, calcining at a temperature substantially less than 900° C. would result in an incomplete reaction. A preferred temperature range is 850° C. to 950° C.

Following calcination, the calcined powder mixture is sintered at a temperature of about 750° C. Sintering is carried out for about 30 minutes. The temperature may be increased up to about 950° or reduced to about 500° C. Sintering times may also be varied between a few minutes and several hours, depending upon the desired microstructure and degree of densification.

After sintering, the powder mixture is annealed at a temperature of about 500° to 650° C. for about one to two hours, in the presence of flowing oxygen. The purpose of annealing in the presence of oxygen is to increase the oxygen content of the ceramic product. Further, annealing at temperatures significantly less than 500° C. may not increase the oxygen content of the powder mixture sufficiently and temperatures in excess of about 700° C. tend to reduce the oxygen content.

The annealed product is then cooled slowly, at a controlled cooling rate to about 200° C., in flowing oxygen. Below 200° C., the product is allowed to cool down to room temperature on its own.

Any or all of the heating steps of the heat treatment may be carried out by heating with microwave energy. The total time involved in such microwave processing may include up to about two hours of calcining, about one-half hour of sintering and about one and one-half hours of annealing. In general, the heat treatment time can vary depending on the mass of the material being treated and the extent of sintering desired. Although longer times are preferable, exceeding certain limits can result in excessive grain growth that may adversely influence the physical properties of the ceramic product. On the other hand, shorter times can leave the process incomplete.

In the present invention, at least one of the heat treatment steps is required to be conducted using microwave energy. However, it is not necessary that all of the heat treatment steps employ microwave energy. In one embodiment of the invention, the powder mixture is calcined using microwave energy, followed by sintering and annealing using conventional heating techniques. As set forth above, all of the heat treatment steps may be carried out using microwave energy.

Especially good results are obtained by calcining the powder mixture in a conventional furnace, followed by sintering and annealing in microwave energy. Annealing of the calcined specimen is one of the most important steps to make the ceramic product superconducting by increasing the oxygen content. Materials prepared by almost any technique, including powder processing, freeze drying, sinter-forging, melt spinning, wire drawing, and thin and thick films formed by various types of spraying and sputtering, and the like, can all be successfully and efficiently annealed in microwave energy. Annealing in microwave energy not only saves time and energy, but potentially provides improved control of the oxygen content of the $YBa_2Cu_3O_{7-x}$ phase in the resultant ceramic product. This is because copper-oxygen is responsible for the heating of the material, caused by its interaction with the microwave radiation. The internal heating mechanism, therefore, provides means of enhanced interaction of oxygen with the material to form the superconducting phase.

One especially preferred method for heating a specimen in microwave energy comprises placing specimens, in the form of pellets, discs or other desired shapes, in a small fused quartz crucible or similar container, and then surrounding the specimens with powders having the same composition as the specimens. The crucible is then insulated by two silica bricks, the upper brick being provided with two small holes to permit temperature measurements and the introduction of oxygen gas. This insulated arrangement is then heated in a microwave oven using microwave energy. This arrangement allows the microwave energy to penetrate into the sample but does not allow the heat generated by the microwave energy to escape from the sample.

The ceramic material produced by the process of the invention described hereinabove comprises a superconducting phase of a Y-Ba-Cu-O system. The ceramic material, which is in the form of discs or pellets, is superconducting at liquid nitrogen temperature.

Although the present invention has been described by reference to the microwave processing of specific materials to produce a superconducting ceramic material comprising a particular superconducting phase, i.e. a Y-Ba-Cu-O ceramic system, the invention is not limited to these specific embodiments. Microwave processing in accordance with the invention is believed to be suitable for the production of other superconducting ceramic materials, such as those containing Tl-Ca-Ba-Cu-O, Sr-La-Cu-O, Ba-La-Cu-O, Ho-Ba-Cu-O, Gd-Ba-Cu-O, and similar phases. Superconducting ceramic materials not based on CuO may also be produced in accordance with the present invention. In general, microwave processing according to this invention may be applied to any ceramic powder mixture which comprises a microwave absorbing material and which can produce a superconducting phase upon heating.

The present invention may be better understood with reference to the following examples.

EXAMPLE I

Samples were prepared from powders of $Y_2O_3$, having a particle size less than 10 μm in diameter; $BaCO_3$, having a particle size about 1 μm in diameter; and CuO, having a particle size less than 800 μm in diameter. The powders had a nominal purity level of 99.999% for $Y_2O_3$ and CuO and 99.9% for $BaCO_3$. The molar ratio of Y:Ba:Cu in the mixture was 1:2:3. These powders were mechanically mixed for 24 hours to ensure homogeneity.

Pellets with an average height of 1.35 mm and an average diameter of 4.85 mm were pressed from 0.1 g of the powder mixture at 430 MPa in a laboratory press. Pellets surrounded by powders of the same composition were put into a small fused quartz crucible which was insulated by two silica bricks. Two small holes in the upper brick allowed for temperature measurements and the introduction of oxygen gas.

The pellets were then heated using a single power (0.7 kW), domestic model microwave oven (Hardwick, 2.45 GHz) to 900° C. in approximately two minutes and calcined for one hour in air and then quenched to room temperature. The pellets were ground in a mortar and pestle and then repelletized. The calcination, grinding and repelletizing steps were repeated two more times for 30 minutes each.

The pellets were then sintered in the microwave oven at 750° C. for 30 minutes and then the samples were cooled slowly to 500° C. in flowing oxygen. Using microwave energy, the samples were then annealed for 1 hour followed by slow cooling to room temperature, both steps taking place in the presence of flowing oxygen.

A scoping test was used to determine if the samples were superconducting at liquid nitrogen temperature. A small samarium/cobalt magnet was placed on each pellet while it was cooled to liquid nitrogen temperature. The samples repelled the magnet, indicating that they were superconducting. The samples were further tested for magnetic susceptibility versus temperature using a Magnetic Properties Measurement System manufactured by Quantum Design. Phase compositions were studied by X-ray analysis and the results were similar to those obtained by conventionally processed superconductors.

EXAMPLE II

The procedure of Example I was repeated with the exception that the sintering and annealing steps were conducted by heating in a conventional oven instead of heating in microwave energy. Similar results were obtained.

EXAMPLE III

The procedure of Example I was repeated with the exception that calcining was conducted by heating in a conventional oven instead of heating in microwave energy. Sintering and annealing were conducted by heating in microwave energy as described in Example I. This sequence of calcining by conventional heating followed by sintering and annealing in microwave energy gave the best results.

Although the present invention has been described with reference to specific embodiments thereof, it is to be understood that modifications may be made without departing from the scope of the present invention as described above and as defined in the claims which follow.

What is claimed is:

1. A process for producing a superconducting ceramic material comprising the steps of:
   mixing powders of $Y_2O_3$, CuO and at least one member selected from the group consisting of $BaCO_3$ and BaO to produce a powder mixture; said powders being mixed in proportions effective to produce a superconducting phase upon being heated together; and then
   subjecting the powder mixture to a heat treatment effective to produce a superconducting ceramic material, said heat treatment comprising at least one step of heating in microwave energy.

2. A process of claim 1, further comprising the step of shaping the powder mixture prior to subjecting the powder mixture to said heat treatment.

3. A process of claim 2, wherein said heat treatment comprises the steps of calcining and then annealing the powder mixture, said calcining being conducted at a temperature of about 900° C. and said annealing being conducted at a temperature of about 500° to 650° C., at least one of said calcining and annealing steps comprising heating in microwave energy.

4. A process of claim 3, wherein said heat treatment further comprises the step of sintering said powder mixture at a temperature of about 750° C., said sintering being conducted after calcining and prior to annealing.

5. A process of claim 3, wherein said annealing is conducted in the presence of flowing oxygen.

6. A process of claim 3, wherein said heat treatment comprises calcining the powder mixture in microwave energy and then annealing the resultant calcined powder mixture by heating in a conventional furnace.

7. A process of claim 1, wherein said heat treatment comprises the steps of calcining the powder mixture by heating at a temperature of about 900° C. in a conventional furnace, forming the calcined powder mixture into pellets or other desired shapes, and then annealing the pellets at a temperature of from about 500° to about 650° C. in microwave energy in the presence of flowing oxygen.

8. A process of claim 1, wherein the molar ratio of Y:Ba:Cu in the powder mixture is about 1:2:3.

9. A process of claim 1, wherein the powder mixture comprises about 13.6 to 16.6% by weight $Y_2O_3$, about 47.7 to 58.2% by weight $BaCO_3$ and about 28.7 to 35.1% by weight CuO, based on the total weight of the powder mixture.

10. A process of claim 9, wherein said powder mixture comprises 15.13% by weight $Y_2O_3$, 52.95% by weight $BaCO_3$ and 31.92% by weight CuO, based on the total weight of the powder mixture.

11. A process of claim 3, wherein both the calcining and annealing steps comprise heating in microwave energy.

12. A process of claim 4, wherein the calcining, sintering and annealing steps all comprise heating in microwave energy.

13. A process for producing a superconducting ceramic material comprising the steps of:
   mixing powders of $Y_2O_3$, CuO and at least one member selected from the group consisting of $BaCO_3$ and BaO to produce a powder mixture having a molar ratio of Y:Ba:Cu of about 1:2:3;
   forming the powder mixture into at least one shaped specimen;
   calcining said specimen at a temperature of about 900° C. for up to two hours;
   sintering the calcined specimen at a temperature of about 750° C. for about 30 minutes;
   cooling the sintered specimen to a temperature of about 500° C. over a period of time of about 30 minutes, in the presence of flowing oxygen;

annealing the sintered specimen at a temperature of about 500° C. in the presence of flowing oxygen for about 1 hour; and then cooling the annealed specimen to room temperature, said cooling including cooling at a controlled rate to a temperature of about 200° C. in the presence of flowing oxygen, to produce a superconducting ceramic material;

wherein at least one of said calcining and annealing steps comprises heating in microwave energy.

14. A process of claim 13, which comprises calcining in microwave energy and annealing by heating in a conventional furnace.

15. A process of claim 13, which comprises calcining by heating in a conventional furnace and annealing in microwave energy.

16. A process of claim 13, wherein all of the calcining, sintering and annealing steps comprise heating in microwave energy.

17. A process for producing a superconducting ceramic material comprising the steps of:

forming a powder mixture comprising at least one microwave absorbing material and at least one additional material, said microwave absorbing material and said additional material producing a superconducting phase upon being heated together; and then subjecting the powder mixture to a heat treatment effective to produce a superconducting ceramic material, said heat treatment comprising at least one step of heating in microwave energy.

18. A process of claim 17, wherein said microwave absorbing material is CuO.

* * * * *